United States Patent [19]

Hohider et al.

[11] Patent Number: 4,968,962
[45] Date of Patent: Nov. 6, 1990

[54] THERMAL CUTOFF AND RESISTOR ASSEMBLY

[75] Inventors: David A. Hohider, Wooster; Ronald A. Nixon, Mansfield, both of Ohio

[73] Assignee: Therm-O-Disc, Incorporated, Mansfield, Ohio

[21] Appl. No.: 464,386

[22] Filed: Jan. 12, 1990

[51] Int. Cl.$^5$ ...................... H01H 85/00; H05K 7/02
[52] U.S. Cl. .................................. 337/4; 174/138 G; 361/417
[58] Field of Search ............... 361/417, 400, 403, 383, 361/427; 338/53, 54, 57, 276, 312; 174/138 G; 337/4, 405, 414; 248/201

[56] References Cited

U.S. PATENT DOCUMENTS

| 4,808,960 | 2/1989 | Nixon | 337/4 |
| 4,821,010 | 4/1989 | Plasko | 337/4 |

FOREIGN PATENT DOCUMENTS 1223013 8/1966 Fed. Rep. of Germany ... 174/138 G

Primary Examiner—H. Broome
Attorney, Agent, or Firm—Jones, Day, Reavis & Pogue

[57] ABSTRACT

A thermal cutoff and a heating resistor are assembled in heat transfer relationship with one another by a metal clip. The assembly is mounted on a base of dielectric material. Electric leads on the thermal cutoff and resistor extend through holes in the base for connection to a printed circuit board.

24 Claims, 4 Drawing Sheets

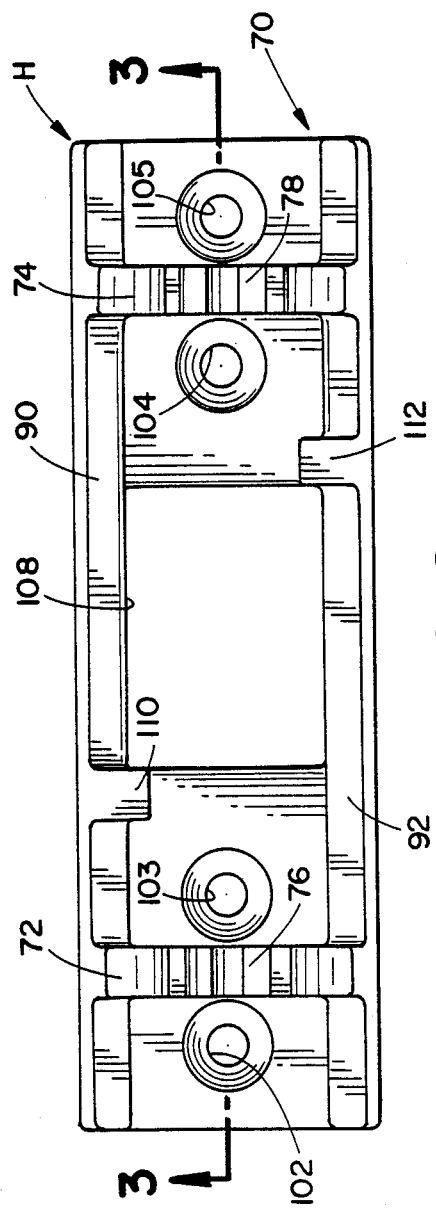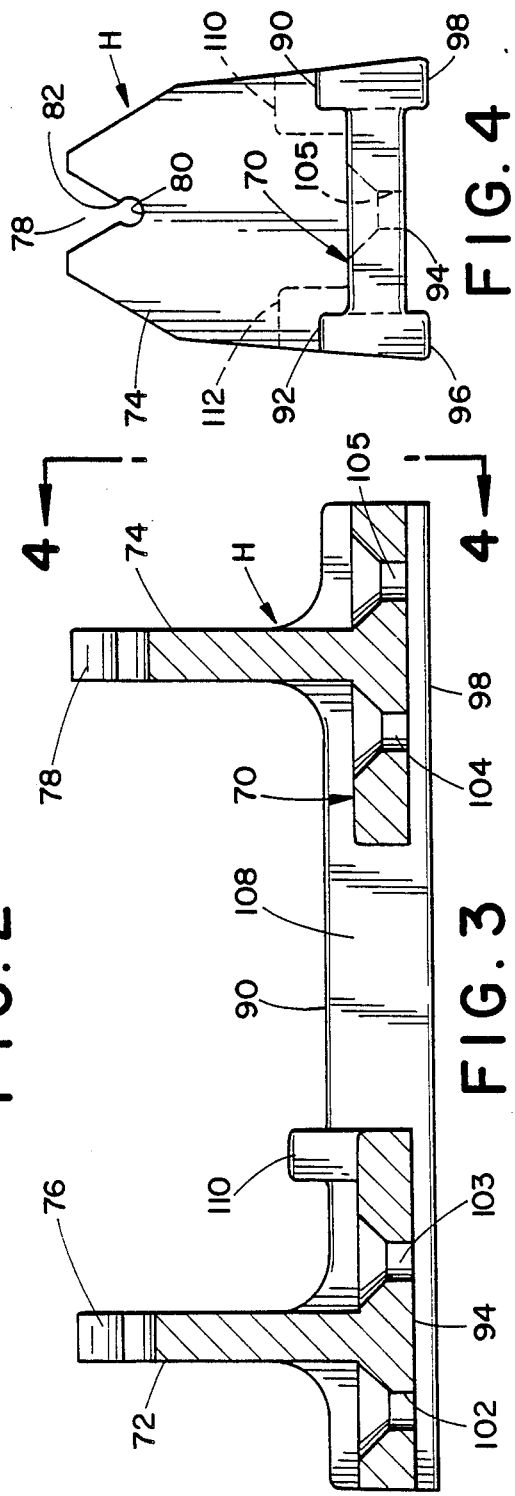

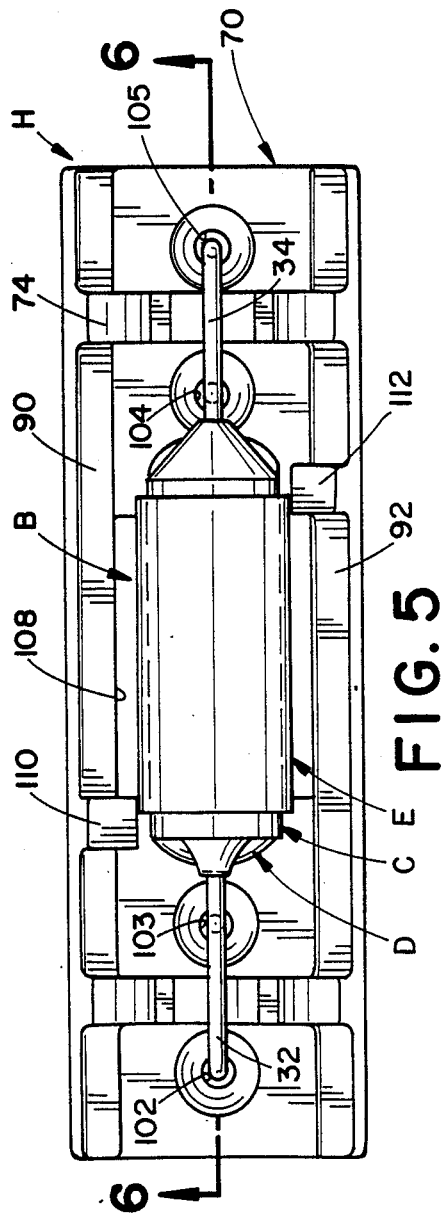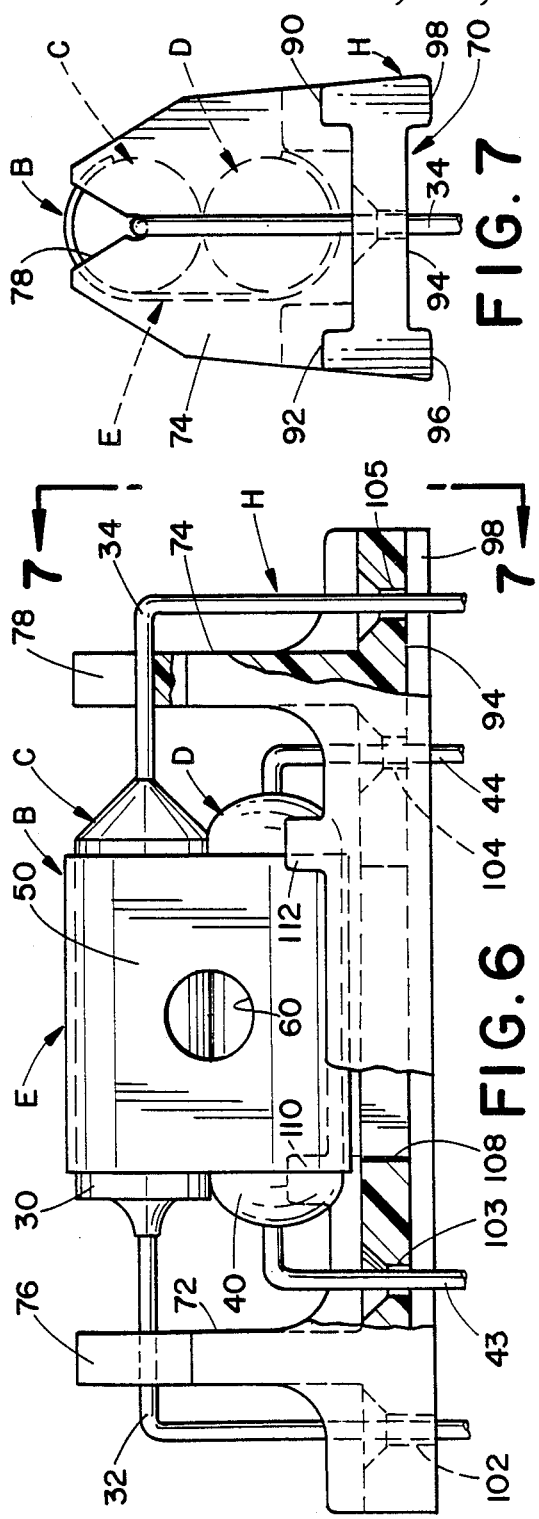

1

THERMAL CUTOFF AND RESISTOR ASSEMBLY

BACKGROUND OF THE INVENTION

This application relates to the art of electric circuit component assemblies and, more particularly, to assemblies of components used for circuit protection. The invention is particularly applicable to arrangements for holding thermal cutoffs and to assembling same with heating resistors. However, it will be appreciated that certain features of the invention have broader aspects and can be used for other purposes.

Thermal cutoffs are commonly combined with a resistance heater. In the event of a circuit malfunction, the resistance heater is energized for rapidly raising the thermal cutoff to a temperature at which it operates to provide an open circuit.

It would be desirable to have a simplified way of mounting a thermal cutoff and for assembling same in heat transfer relationship with a resistor.

SUMMARY OF THE INVENTION

A thermal cutoff and a resistor are assembled in adjacent side-by-side heat transfer relationship with one another. In a preferred arrangement, the thermal cutoff and resistor are held in assembled heat transfer relationship with one another by a metal clip.

In one arrangement, the thermal cutoff and resistor are held in physical contact with one another by the metal clip. In another arrangement, a portion of the metal clip is interposed between the thermal cutoff and resistor.

Each of the thermal cutoff and resistor have leads which may be specially shaped to provide a standoff for supporting the assembly above a printed circuit board.

The metal clip used to hold the thermal cutoff and resistor in assembled relationship may be shaped to provide standoffs for holding the assembly spaced from the surface of a printed circuit board.

A thermal grease may be provided between the thermal cutoff and resistor for enhancing heat transfer from the resistor to the thermal cutoff.

A holder of dielectric material is preferably provided for holding the assembled thermal cutoff and resistor. The holder includes a base and a pair of spaced-apart supports extending outwardly from one side of such base. The supports have terminal end portions having lead receiving means for receiving and supporting leads on a thermal cutoff to hold such cutoff suspended between the supports. Holes through the base adjacent the supports receive the leads on a thermal cutoff.

The holder preferably includes abutment means thereon for engagement by an assembled thermal cutoff and resistor to prevent rotation of such assembly relative to the holder.

A large hole may be provided through the holder base in alignment with the assembled resistor and thermal cutoff for minimizing heat transfer from such assembly to the holder base. The holder base may also be provided with a cover.

It is a principal object of the present invention to provide an improved thermal cutoff and resistor assembly.

It is another object of the invention to provide an improved holder for holding a thermal cutoff.

It is a further object of the invention to provide an improved holder for holding a assembled thermal cutoff and resistor in a desired relationship with on another.

It is an additional object of the invention to provide a simplified and economical arrangement for assembling a thermal cutoff and resistor.

BRIEF DESCRIPTION OF THE DRAWING

FIG. 2 is a top plan view of a holder;

FIG. 3 is a cross-sectional elevational view taken generally on line 3—3 of FIG. 2;

FIG. 4 is an end elevational view taken generally on line 4—4 of FIG. 3;

FIG. 5 is a plan view similar to FIG. 2, and showing a thermal cutoff and resistor assembly mounted on the holder;

FIG. 6 is a cross-sectional elevational view taken generally on line 6—6 of FIG. 5;

FIG. 7 is an end elevational view taken generally on line 7—7 of FIG. 6;

DESCRIPTION OF PREFERRED EMBODIMENTS

Figure 1:
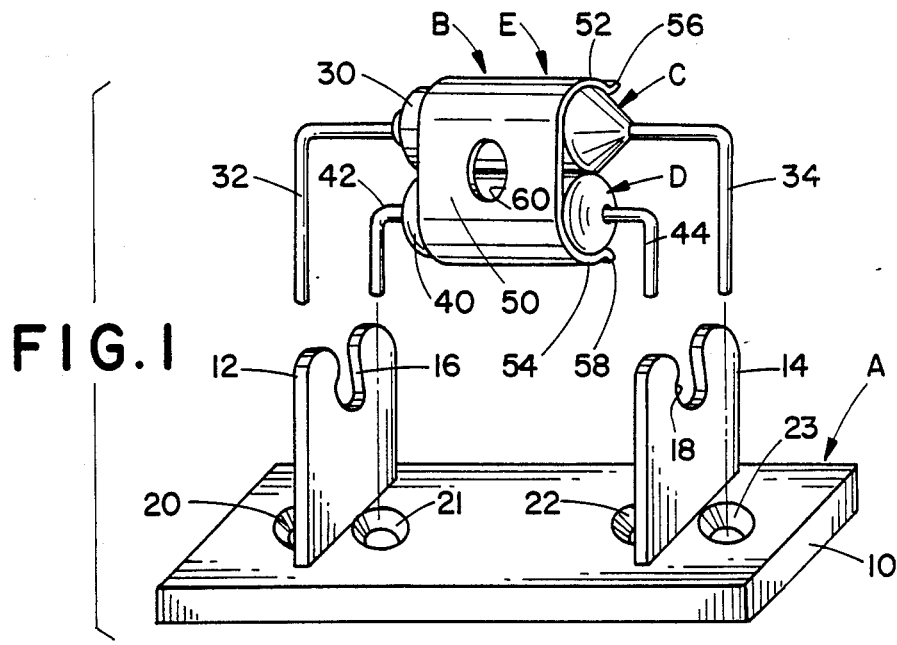
FIG. 1 is a diagrammatic perspective illustration of a thermal cutoff and resistor assembly in accordance with the present application.

Referring now to the drawing, wherein the showings are for purposes of illustrating certain preferred embodiments of the invention only and not for purposes of limiting same, FIG. 1 shows a holder A of dielectric material. An assembly B of a thermal cutoff C, resistor D and metal clip E is adapted to be mounted on and held by holder A.

Holder A includes a base 10 having a pair of spaced-apart supports 12, 14 extending outwardly from one side thereof. Supports 12, 14 have terminal end portions with lead receiving means 16, 18 in the form of keyhole slots. Holes 20, 21 extend through base 10 on opposite sides of support 12, and holes 22, 23 extend through base 10 on the opposite sides of support 14.

Thermal cutoff C includes a cylindrical main body portion 30 having a pair of leads 32, 34 extending outwardly from the opposite ends thereof. Thermal cutoff C may take many forms, and may be of the type disclosed in U.S. Pat. No. 4,808,960 issued Feb. 28, 1989, the disclosure of which is hereby incorporated herein by reference. The thermal cutoff includes normally closed contacts, one of which is movable and biased to a closed position by a spring acting against a meltable thermal pellet. When the pellet melts, the force of the spring is substantially reduced and overcome by the force of a second spring biasing the movable contact in an open direction.

Resistor D includes an elongated cylindrical main body 40 having leads 42, 44 extending outwardly from the opposite ends thereof. Resistor D may be of a conventional type such as a wire wound or metal film resistor in which a resistance wire or film is provided on a ceramic tube and encapsulated in a dielectric ceramic coating having a high thermal transfer coefficient.

Metal clip E is preferably of beryllium copper to provide good heat transfer from resistor D to thermal cutoff C. Clip E is generally U-shaped in an end view, and includes a substantially flat base portion 50 having a pair of curved arms extending therefrom and toward one another. Arms 52, 54 have a curvature that is approximately the same or slightly smaller than the curvature of bodies 30, 40 of thermal cutoff C and resistor D. Arms 52, 54 terminate in outwardly curved end portions 56, 58 to facilitate snapping one of the thermal cutoff or resistor into the clip once one is already in position. The distance between arms 52, 54 is preferably less than the combined diameters of bodies 30, 40 of thermal cutoff C and resistor D. Thus, arms 52, 54 will be under bending stress when the thermal cutoff and resistor are received therein, and will bias the thermal cutoff and resistor into firm physical engagement with one another for optimum heat transfer.

Although the thermal cutoff and resistor could be of different sizes, the preferred arrangement has a thermal cutoff and resistor whose main body portions 30, 40 have approximately the same diameter. This simplifies manufacture of the clip and also simplifies assembly of the components into the clip. Body 40 of resistor D will generally be up to around 15% longer than body 30 of thermal cutoff C in order to provide the desired wattage for the resistor.

Thermal cutoff C and resistor D make line contact with one another in an engagement area that is spaced outwardly from base 50 of clip E. Base 50 of clip E has a central hole 60 therethrough aligned with such engagement area for providing access to the space between clip base 50 and the engagement area of the thermal cutoff and resistor The defined space may be filled with a thermal grease by injecting same through hole 60. The thermal grease may be of any conventional type, such as a silicone grease filled with a ceramic powder to provide good heat transfer characteristics.

The sizes of keyhole slots 16, 18 and thermal cutoff leads 32, 34 are such that the leads snap into the slots and are held thereby. Thermal cutoff leads 32, 34 extend through holes 20, 23 in base 10, while resistor leads 42, 44 extend through holes 21, 22 in base 10. Thus, assembly B is suspended between supports 12, 14 spaced slightly above base 10. Thermal cutoff C is preferably located above resistor D to enhance heat transfer from the resistor to the thermal cutoff. Heat is transferred from resistor D to thermal cutoff C by conduction, convection and radiation. The metal clip and thermal grease optimize heat conduction from the resistor to the thermal cutoff.

FIGS. 2-4 show a preferred holder H molded in one piece of dielectric material, such as a glass filled polyamide. Holder H includes a generally rectangular base portion 70 having a pair of spaced-apart supports 72, 74 extending outwardly from one side thereof. Supports 72, 74 have terminal end portions with central lead receiving means 76, 78 thereon. As best shown in FIG. 4, lead receiving means 78 includes a generally circular hole 80 having a diameter approximately the same as or slightly greater than the diameter of a lead on a thermal cutoff to be assembled to the holder. A narrowed entrance 82 to hole 80 has a width that is smaller than the diameter of the hole and slightly smaller than the diameter of the leads on the thermal cutoff so that a lead snaps through narrowed entrance opening 82 into hole 80. Lead receiving means 78 diverges upwardly from narrowed entrance opening 82 for automatically guiding a lead toward hole 80. Lead receiving means 76 on support 72 is similarly shaped.

Continuous narrow walls 90, 92 extend upwardly from base portion 70 adjacent the long sides thereof for stiffening base portion 70 against bending. Such continuous walls also project downwardly below bottom surface 94 of base portion 70 to define opposite elongated legs 96, 98 which are positionable against the surface of a printed circuit board for supporting bottom surface 94 of base portion 70 above the board.

Holes 102, 103 extend through base portion 70 on opposite sides of support 72. Holes 104, 105 extend through base portion 70 on opposite sides of support 74. Each hole has a generally frusto-conical or funnel-shaped chamfer concentric therewith on the upper surface of base portion 70 for guiding leads through the holes.

A central rectangular opening 108 is formed through base portion 70, and is also centrally located between supports 72, 74. As shown in FIG. 2, opening 108 extends through at least one-half the width of base portion 70 measured in a direction perpendicular to walls 90, 92. Opening 108 has a length measured parallel to walls 90, 92 that is at least one-third of the distance between supports 72, 74. Abutment means 110, 112 extends upwardly and inwardly from walls 90, 92 at diagonally opposite corner of rectangular opening 108. When an assembly B of FIG. 1 is supported on holder H, resistor D and the bottom portion of clip E are closely received between abutment means 110, 112 to prevent rotation of assembly B about the thermal cutoff leads that suspend the assembly from supports 72, 74.

FIGS. 5-7 show assembly B mounted on holder H. If a hole in a printed circuit board is slightly misaligned with respect to one or more of holes 102-105 in base portion 70, spacing bottom surface 94 of base portion 70 above the printed circuit board allows the leads on the thermal cutoff and resistor to be bent slightly laterally between the printed circuit board and bottom surface 94 to accommodate such misalignment and to allow cleaning of flux after soldering to the circuit board.

Opening 108 is base portion 70 minimizes the amount of heat that is absorbed by holder H from resistor D and clip E.

Figure 8:
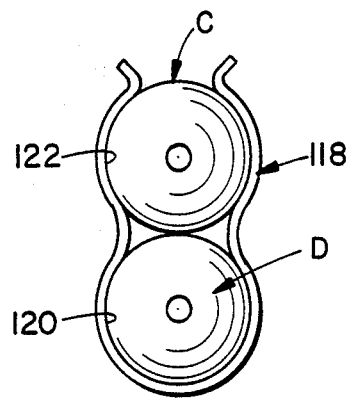
FIG. 8 is an end elevational view showing an assembled thermal cutoff and resistor using a modified clip.

FIGS. 8-14 show other clip arrangements for use with thermal cutoffs and resistors having approximately the same diameter. FIG. 8 shows a generally U-shaped clip 118 having first and second arcuate portions 120, 122 whose center lines are spaced-apart a distance slightly less than the diameter of the thermal cutoff or resistor. In addition, the curvature of the arcuate portions is slightly less than the curvature of the thermal cutoff and resistor. This arrangement causes the thermal cutoff and resistor to be firmly gripped resiliently and to be biased into good heat transfer engagement with one another.

Figure 9:
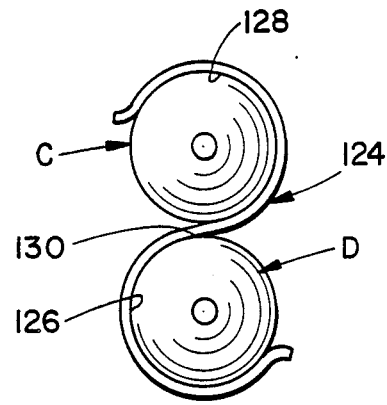
FIG. 9 is an end elevational view showing an assembled thermal cutoff and resistor using still another modified clip.

FIG. 9 shows an arrangement wherein a clip 124 is generally S-shaped in an end view to provide oppositely facing arcuate portions 126, 128 whose center lines are spaced-apart a distance slightly less than the diameter of a thermal cutoff or resistor. When a thermal cutoff C and resistor D are firmly gripped in arcuate portions 126, 128, a portion 130 of clip 124 is interposed between same in good heat transfer relationship therewith.

Figure 11:
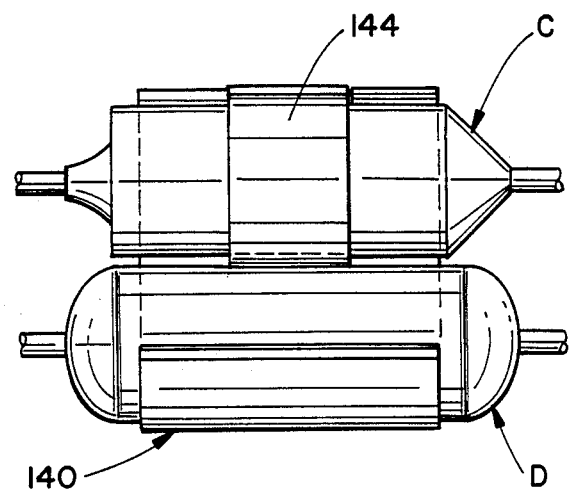
FIG. 11 is a side elevational view taken generally on line 11—11 of FIG. 10.
Figure 10:
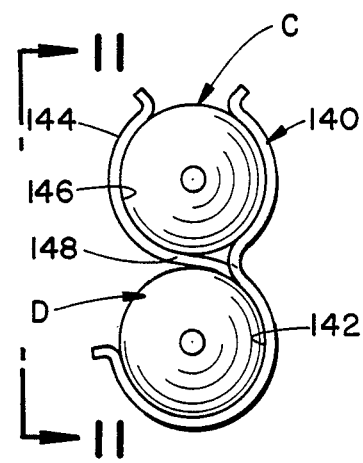
FIG. 10 is an end elevational view showing an assembled thermal cutoff and resistor using still another modified clip.

In FIGS. 10 and 11, clip 140 has an arcuate portion 142 for tightly gripping resistor D and has a finger 144 bent outwardly therefrom to define a second arcuate portion 146 in which thermal cutoff C is firmly gripped. The arcuate portions are shaped such that both the thermal cutoff and resistor are biased toward one another and into engagement with a portion 48 of finger 144.

Figure 12:
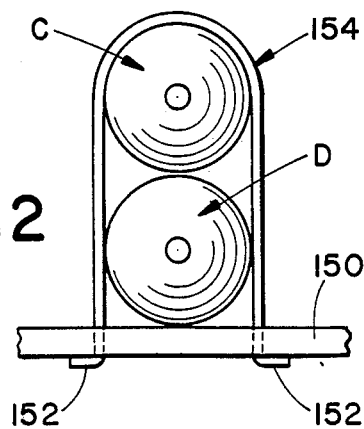
FIG. 12 is an end elevational view of still another arrangement for assembling a thermal cutoff and resistor to a base.

FIG. 12 shows a flat base 150 having suitable spaced holes therethrough for receiving hooked ends 152 on a clip 154 in which thermal cutoff C and resistor D are resiliently held.

Figure 13:
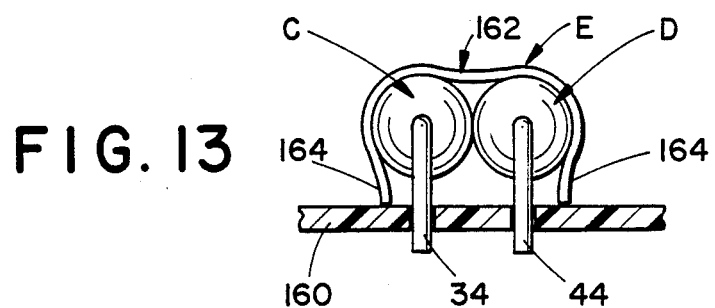
FIG. 13 is an end elevational view of an assembled thermal cutoff and resistor with a still further modified clip provided with standoffs.

FIG. 13 shows a portion of a printed circuit board 60 having suitable holes therein for receiving leads 34, 44 on thermal cutoff C and resistor D. Clip 162 is shaped to firmly resiliently grip thermal cutoff C and resistor D, and to bias into firm engagement with one another. Clip E has terminal standoff portions 164 for engaging the surface of printed circuit board 160 and holding thermal cutoff C and resistor D spaced outwardly from such surface of the board.

Figure 14:
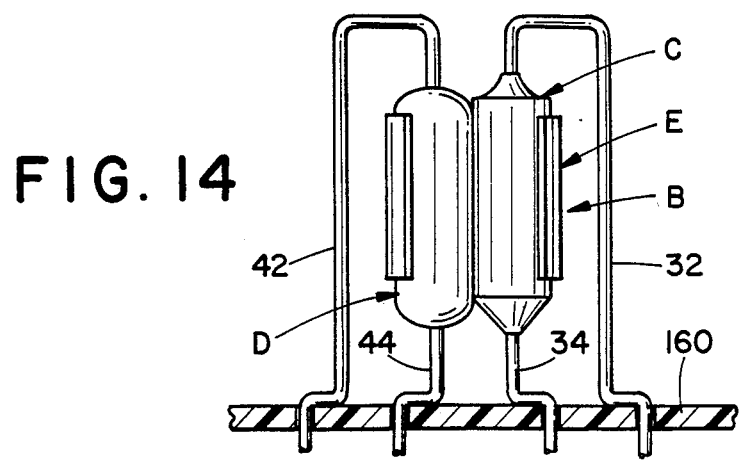
FIG. 14 is an elevational view showing an assembled thermal cutoff and resistor having leads that are specially shaped for insertion through holes in a printed circuit board while also providing standoffs for holding the thermal cutoff and resistor assembly elevated above the board.

FIG. 14 shows an arrangement wherein clip E of FIG. 1 holds thermal cutoff C and resistor D in good heat transfer relationship with one another. In this arrangement, instead of the longitudinal axes of the thermal cutoff and resistor extending generally parallel to the printed circuit board, they extend generally perpendicular thereto. The terminal end portions of leads 32, 34 and 42, 44 are bent laterally at right angles to define short horizontal standoff portions and are then again bent at right angles for reception in suitable holes in printed circuit board 160. The lateral standoff portions are capable of supporting the assembled thermal cutoff and resistor elevated above the printed circuit board.

Although the use of a metal clip is the preferred arrangement, it will be recognized that it is possible to assemble the thermal cutoff and resistor without the use of a metal clip. The thermal cutoff and resistor can be potted together in heat transfer relationship using a potting compound having good thermal conductivity. Also, it is possible to weld or glue assembly B to a holder A or H. However, the arrangement shown and described is preferred because it does not require the use of any glue, solder or welds.

Although the invention has been shown and described with respect to certain preferred embodiments, it is obvious that equivalent alterations and modifications will occur to others skilled in the art upon the reading and understanding of this specification. The present invention includes all such equivalent alterations and modifications, and is limited only by the scope of the claims.

We claim:

1. A thermal cutoff holder comprising a base of dielectric material, a pair of spaced-apart supports of dielectric material extending outwardly from one side of said base, said supports having terminal end portions, said terminal end portions having lead receiving means for receiving leads on a thermal cutoff to hold the cutoff suspended between said supports, and holes through said base adjacent said supports for receiving leads on a thermal cutoff.

2. The holder of claim 1 wherein said base has lead receiving holes therethrough on opposite sides of each said support.

3. The holder of claim 1 wherein said lead receiving means comprises generally keyhole-shaped slots in said supports and into which slots the leads on a thermal cutoff can be snapped.

4. The holder of claim 1 wherein said supports are integral with said base.

5. The holder of claim 1 including a thermal cutoff and a resistor positioned in heat transfer relationship with one another between said supports, said thermal cutoff having leads received in said lead receiving means on said supports to hold said thermal cutoff and resistor suspended between said supports in spaced relationship to said base.

6. The holder of claim 5 wherein said thermal cutoff and said resistor are positioned with said resistor interposed between said base and said thermal cutoff.

7. The holder of claim 5 including a resilient metal clip holding said thermal cutoff and said resistor in assembled relationship with one another and biasing same into engagement with one another.

8. The holder of claim 7 wherein said thermal cutoff and said resistor engage one another at an engagement area that is spaced outwardly from said clips, and said clip having a hole therethrough providing access to the space between said clip and said engagement area.

9. The holder of claim 5 wherein said base has inner lead receiving holes therethrough located between said supports and outer lead receiving holes therethrough outwardly of said supports, said thermal cutoff having leads extending through said outer lead receiving holes and said resistor having leads extending through said inner lead receiving holes.

10. The holder of claim 1 wherein said base has opposite faces and said supports extend outwardly from one of said faces, and feet extending outwardly from the other of said faces for supporting said holder on a surface with said other faces spaced from such surface.

11. The holder of claim 1 including a large opening through said base between said supports.

12. The holder of claim 11 wherein said opening extends through at least one-half the width of said base and has a length that is at least one-third of the distance between said supports.

13. The holder of claim 1 including spaced-apart abutment means extending outwardly from said base between said supports for preventing rotation of an assembled thermal cutoff and resistor relative to said holder 14. The holder of claim 1 including generally frustoconical chamfers in said base concentric with said lead receiving holes, said chamfers being on the same side of said base as said supports.

15. An electrical component holder comprising a base of dielectric material and having opposite ends and opposite sides, a pair of spaced-apart supports of dielectric material extending outwardly from one surface of said base and being spaced inwardly from said opposite ends of said base, said supports having terminal end portions, electrical component holding means on said terminal end portions for holding an electrical component suspended between said supports, and holes through said base adjacent said supports for receiving leads on an electrical component.

16. The holder of claim 15 wherein said one surface of said base from which said supports extend comprises a front surface, said base having a rear surface opposite from said front surface, and support legs projecting outwardly from said rear surface for supporting said holder on a substrate with said rear surface spaced from such substrate.

17. The holder of claim 16 wherein said legs extend substantially the entire length of said base adjacent said opposite sides thereof.

18. The holder of claim 15 including stiffening ribs extending upwardly from said one surface adjacent said opposite sides of said base.

19. The holder of claim 18 including an opening through said base between said supports and said stiffening ribs, said opening being spaced from and substantially centered between said supports.

20. The holder of claim 19 including abutment means extending outwardly from said base adjacent said opening for preventing rotation of an electrical component suspended between said supports.

21. A thermal cutoff and resistance heater assembly comprising:
  a thermal cutoff including a main body portion having opposite end portions and an electrical lead extending outwardly from each of said end portions,
  a resistance heater including a heater main body portion having opposite heater end portions and a heater electrical lead extending outwardly from each of said heater end portions,
  said main body portions being positioned in adjacent side-by-side heat transfer relationship with one another, and
  a metal clip cooperating with said main body portions for holding said main body portions together in assembled relationship.

22. The assembly of claim 21 wherein said metal clip includes an interposed portion that is interposed between said main body portions.

23. The assembly of claim 21 wherein said main body portions are in direct heat transfer engagement with one another.

24. The assembly of claim 23 wherein said metal clip biases said main body portions into firm engagement with one another.

* * * * *